United States Patent
Miller et al.

(10) Patent No.: US 10,355,677 B1
(45) Date of Patent: *Jul. 16, 2019

(54) CURRENT DRIVER SYSTEM

(71) Applicants: Donald L. Miller, Export, MD (US); Quentin P. Herr, Ellicott City, MD (US)

(72) Inventors: Donald L. Miller, Export, MD (US); Quentin P. Herr, Ellicott City, MD (US)

(73) Assignee: NORTHROP GRUMMAN SYSTEMS CORPORATION, Falls Chuch, VA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/151,009

(22) Filed: Oct. 3, 2018

Related U.S. Application Data

(63) Continuation of application No. 15/972,995, filed on May 7, 2018, now Pat. No. 10,122,352.

(51) Int. Cl.
*H03K 19/195* (2006.01)
*H03K 3/38* (2006.01)
(Continued)

(52) U.S. Cl.
CPC ............... *H03K 3/38* (2013.01); *G06N 10/00* (2019.01); *G11C 11/16* (2013.01); *G11C 11/44* (2013.01); *H01L 39/025* (2013.01)

(58) Field of Classification Search
None
See application file for complete search history.

(56) References Cited

U.S. PATENT DOCUMENTS

| 3,341,380 A | 9/1967 | Mets et al. |
| 4,117,354 A | 9/1978 | Geewala |

(Continued)

FOREIGN PATENT DOCUMENTS

| EP | 0467104 | 1/1992 |
| EP | 3217336 | 9/2017 |

(Continued)

OTHER PUBLICATIONS

Berns et al., "Coherent Quasiclassical Dynamics of a Persistent Current Qubit", Physical Review Letters APS USA, vol. 97, No. 15, pp. 150502, Oct. 13, 2006.

(Continued)

*Primary Examiner* — Anh Q Tran
(74) *Attorney, Agent, or Firm* — Tarolli, Sundheim, Covell & Tummino LLP

(57) ABSTRACT

One example includes a current driver system. The system includes a current source configured to provide a source current to a transition node. The system also includes a Josephson latch comprising at least one Josephson junction stage. The at least one Josephson junction stage can be configured to conduct the source current from the transition node as a current-clamped bias current in a deactivated state of the Josephson latch. The Josephson latch can be configured to activate in response to the bias current and a trigger pulse to switch the at least one Josephson junction stage to a voltage state to conduct at least a portion of the source current from the transition node as an output current to a load in response to activation of the Josephson latch.

20 Claims, 2 Drawing Sheets

(51) Int. Cl.
*G11C 11/16* (2006.01)
*H01L 39/02* (2006.01)
*G11C 11/44* (2006.01)
*G06N 10/00* (2019.01)

(56) References Cited

U.S. PATENT DOCUMENTS

| | | |
|---|---|---|
| 4,132,956 A | 1/1979 | Russer |
| 4,149,097 A | 4/1979 | Faris |
| 4,274,015 A | 6/1981 | Faris |
| 4,360,898 A | 11/1982 | Faris |
| 4,916,335 A | 4/1990 | Goto |
| 5,051,627 A | 9/1991 | Schneier |
| 5,099,152 A | 3/1992 | Suzuki |
| 5,309,038 A | 5/1994 | Harada |
| 5,942,950 A | 8/1999 | Merenda |
| 6,188,236 B1 | 2/2001 | Wikborg |
| 6,486,756 B2 | 11/2002 | Tarutani |
| 6,507,234 B1 | 1/2003 | Johnson |
| 6,518,786 B2 | 2/2003 | Herr |
| 6,549,059 B1 | 4/2003 | Johnson |
| 6,617,643 B1 | 9/2003 | Goodwin-Johansson |
| 6,724,216 B2 | 4/2004 | Suzuki |
| 6,750,794 B1 | 6/2004 | Durand |
| 6,865,639 B2 | 3/2005 | Herr |
| 6,897,468 B2 | 5/2005 | Blais |
| 6,960,780 B2 | 11/2005 | Blais |
| 6,960,929 B2 | 11/2005 | Bedard |
| 7,129,870 B2 | 10/2006 | Hirano |
| 7,498,832 B2 | 3/2009 | Baumgardner |
| 7,613,765 B1 | 11/2009 | Hilton |
| 7,714,605 B2 | 5/2010 | Baumgardner |
| 7,724,020 B2 | 5/2010 | Herr |
| 7,772,871 B2 | 8/2010 | Herr |
| 7,772,872 B2 | 8/2010 | Lewis |
| 7,782,077 B2 | 8/2010 | Herr |
| 7,977,964 B2 | 7/2011 | Herr |
| 8,022,722 B1 | 9/2011 | Pesetski |
| 8,111,083 B1 | 2/2012 | Pesetski |
| 8,508,280 B2 | 8/2013 | Naaman |
| 8,975,912 B2 | 3/2015 | Chow |
| 9,000,621 B2 | 4/2015 | Ichikawa |
| 9,208,861 B2 | 12/2015 | Herr |
| 9,281,057 B1 | 3/2016 | Herr |
| 9,735,776 B1 | 8/2017 | Abdo |
| 10,122,352 B1 * | 11/2018 | Miller ............... H03K 19/1952 |
| 2002/0063643 A1 | 5/2002 | Smith |
| 2002/0190381 A1 | 12/2002 | Herr |
| 2003/0011398 A1 | 1/2003 | Herr |
| 2003/0016069 A1 | 1/2003 | Furuta |
| 2003/0039138 A1 | 2/2003 | Herr |
| 2003/0040440 A1 | 2/2003 | Wire |
| 2003/0115401 A1 | 6/2003 | Herr |
| 2003/0183935 A1 | 10/2003 | Herr |
| 2003/0207766 A1 | 11/2003 | Esteve |
| 2004/0120444 A1 | 6/2004 | Herr |
| 2004/0201099 A1 | 10/2004 | Herr |
| 2004/0201400 A1 | 10/2004 | Herr |
| 2005/0001209 A1 | 1/2005 | Hilton |
| 2005/0023518 A1 | 2/2005 | Herr |
| 2005/0098773 A1 | 5/2005 | Vion |
| 2005/0110106 A1 | 5/2005 | Goto |
| 2005/0224784 A1 | 10/2005 | Amin |
| 2005/0231196 A1 | 10/2005 | Tarutani |
| 2006/0091490 A1 | 5/2006 | Chen |
| 2007/0052441 A1 | 3/2007 | Taguchi |
| 2009/0082209 A1 | 3/2009 | Bunyk |
| 2009/0084991 A1 | 4/2009 | Ichimura |
| 2009/0153180 A1 | 6/2009 | Herr |
| 2009/0289638 A1 | 11/2009 | Farinelli |
| 2009/0322374 A1 | 12/2009 | Przybysz |
| 2011/0175062 A1 | 7/2011 | Farinelli |
| 2012/0094838 A1 | 4/2012 | Bunyk |
| 2013/0015885 A1 | 1/2013 | Naaman |
| 2013/0043945 A1 | 2/2013 | McDermott |
| 2015/0092465 A1 | 4/2015 | Herr |
| 2017/0141769 A1 | 5/2017 | Miller et al. |

FOREIGN PATENT DOCUMENTS

| | | |
|---|---|---|
| EP | 3378162 A1 | 9/2018 |
| JP | S6192036 | 5/1986 |
| JP | 2001345488 | 12/2001 |
| WO | 199808307 | 2/1998 |
| WO | 2003090162 | 10/2003 |
| WO | 2005093649 | 10/2005 |
| WO | 2008050864 | 5/2008 |
| WO | 2009157532 | 12/2009 |
| WO | 2010028183 | 3/2010 |
| WO | 2016127021 | 8/2016 |
| WO | 2017087070 A1 | 5/2017 |

OTHER PUBLICATIONS

Garanin et al., Effects of nonlinear sweep in the Landau-Zener-Stueckelberg effect, Physical Review B, vol. 66, No. 17, pp. 174438-1-174438-11, Nov. 1, 2002.

Koch, et al.: "A NRZ—Output Amplifier for RSFQ Circuits", IEEE Transaction on Applied Superconductivity, vol. 9, No. 2, pp. 3549-3552, Jun. 1999.

Wulf et al., Dressed States of Josephson Phase Qubit Coupled to an LC Circuit, IEEE Transaction on Applied Superconductivity IEEE USA, vol. 15, No. 2, pp. 856-859, Jun. 2, 2005.

Schuenemann C. et al. "Interleaved Josephson junction tree decoder," IBM Technical Disclosure Bulletin, International Business Machines Corp. (Thorwood), US, vol. 18, No. 12, Apr. 30, 1976, pp. 4168, line 1—p. 4170, line 29; figures I, II.

International Search Report & Written Opinion corresponding to International Application No. PCT/US2018/051076 dated Jan. 2, 2019.

International Search Report & Written Opinion corresponding to International Application No. PCT/US2018/0042466 dated Dec. 12, 2018.

International Search Report & Written Opinion corresponding to International Application No. PCT/US2008/050864 dated Sep. 6, 2008.

Ortlepp et al.; "Experimental Analysis of a new Generation of compact Josephson-inductance-based RSFQ Circuits"; Authors are with the Institute of Information Technology, University of Technology Germany.

Internation Search Report & Written Opinion corresponding to International Application No. PCT/US2008/072017 dated Feb. 23, 2009.

Gopalakrishnan, R. et al.: "Novel Very High IE Structures Based on the Directed BBHE Mechanism for Ultralow-Power Flash Memories", IEEE Electron Device Letters, vol. 26, No. 3, Mar. 2005.

Choi, W. Y. et al.: "80nm Self-Aligned Complementary I-MOS Using Double Sidewall Spacer and Elevated Drain Structure and Its Applicability to Amplifiers with High Linearity", IEEE Electron Device Letters, vol. 8, No. 5, dated 2004.

Choi, W. Y. et al.: "Novel Tunneling Devices with Multi-Functionality", Japanese Journal of Applied Physics, vol. 16, No. 1B, dated 2007; pp. 2622-2625.

International Search Report corresponding to International Application No. PCT/US2009/045167, dated Feb. 5, 2010.

Semenov, et. al, "SFQ Control Circuits for Josephson Junction Qubits", IEEE Trans. on Applied Superconductivity, vol. 13, No. 2, Jun. 2003, pp. 960-965.

Canadian Office Action corresponding to Canadian Patent Application No. 2882109 dated Mar. 11, 2016.

Polonsky, et. al., Transmission of Single-Flux-Quantum Pulses along Superconducting Microstrip Lines, IEEE Trans. On Applied Superconductivity, vol. 3, No. 1, Mar. 1993, pp. 2598-2600.

Ohki et. al., "Low-Jc Rapid Single Flux Quantum (RSFQ) Qubit Control Circuit", IEEE Transactions on Applied Superconductivity, vol. 17, No. 2, Jun. 2007.

(56) References Cited

OTHER PUBLICATIONS

Allman, et al: "rt-SQUID-Mediated Coherent Tunable Coupling Between a Superconducting Phase Qubit and a Lumped-Element Resonator"; Physical Review Letters, 2010 The American Physical Society, PRL 104, week ending Apr. 30, 2010, pp. 177004-1 thru 177004-4.
Johnson, et al.: "A Scalable Control System for a Superconducting Adiabatic Quantum Optimization Processor"; arXiv:0907.3757v2 fquant-phl Mar. 24, 2010, pp. 1-14.
Saira, et al.: "Entanglement genesis by anciila-based parity measurement in 20 circuit QED" Physical review letters 1 i 2.7 (2014): 070502.
Galiautdinov, et al.: "Resonator-zero-qubit architecture for superconducting qubits" Physical Review A 85.4 (2012): 042321, Department of Electrical Engineering and Physics, University of California. pp. 1-11.
Bourassa, et al.: "Ultra.strong coupling regime of cavity QED with phase-biased flux qubits" Physical Review A 80.3 (2009): 032109.
International Search Report corresponding to International Application No. PCT/US2015/052666 dated Jan. 3, 2016.
RSFQubit, RSFQ Control of Josephson Junctions Qubits, D7: Report on the Evaluation of the RSFQ Circuitry for Qubit Control, Sep. 1, 2005, pp. 1-16.
Herr, et al: "Ultra-Low-Power Superconductor Logic", Journal of Applied Physics, American Institute of Physics, US, vol. 109, No. 10, May 17, 2011, pp. 103903-103903, XP012146891, ISSN: 0021-8979, 001: 10.1063/1.3585849, p. 2, left-hand column, paragraph 4—right-hand column, paragraph 1; Fig. 1.
Gui-Long, et al., "A Simple Scheme to Generate X-type Four-charge Entangled States in Circuit QED", Chinese Physics B, Chinese Physics B, Bristol GB, vol. 21, No. 4, Apr. 5, 2012 (Apr. 5, 2012), pp. 44209/1-5. XP020221550, ISSN: 1674-1056, DOI: 10.1088/1674-1056/21/4/044209.
International Search Report corresponding to International Application No. PCT/US2016/053412, dated Dec. 21, 2016.
International Search Report corresponding to International Application No. PCT/US2013/054161, dated Feb. 25, 2014.
Canadian Office Action corresponding to Canadian Patent Application No. 3003272 dated Feb. 12, 2019.
Canadian Office Action corresponding to Canadian Patent Application No. 2973060, dated Dec. 18, 2018.

\* cited by examiner

CURRENT DRIVER SYSTEM

RELATED APPLICATIONS

This application claims priority from U.S. patent application Ser. No. 15/972,995, filed 7 May 2018, which is incorporated herein in its entirety.

TECHNICAL FIELD

This disclosure relates generally to classical and quantum computing systems, and more specifically to a current driver system.

BACKGROUND

Current sources are an essential component of any computer architecture. For example, current sources are typically implemented to provide currents to select rows and columns of memory circuits, such as in an array of memory cells, to write data to and/or read data from the respective memory array. For example, in a Josephson Magnetic Random Access Memory (JMRAM) array, a write current can supply a magnetic field to control a direction of magnetization of a ferromagnetic layer which constitutes one component of the barrier in a magnetic barrier Josephson junction. Such write operations in a JMRAM array can require a sufficient current amplitude that can be provided from a current source, such as in the order of several milliamperes, and which can be significantly greater than a given threshold critical current for Josephson junctions that are currently able to be fabricated. Thus, such exemplary operations may require current drivers that are able to provide such amplitudes of current to a load, such as a row of memory cells.

SUMMARY

One example includes a current driver system. The system includes a Josephson latch comprising at least one Josephson junction stage configured to conduct the source current from the transition node in a deactivated state of the Josephson latch. The Josephson latch is also configured to switch to an activated state in response to a trigger signal to switch the at least one Josephson junction stage to a voltage state to provide at least a portion of the source current from the transition node as an output current to a load.

Another example includes a current driver system. The system includes a Josephson latch comprising a plurality of Josephson junction stages and at least one resistor that each interconnects a pair of the plurality of Josephson junction stages. The Josephson latch can be configured to conduct the source current from the transition node in a deactivated state and to conduct at least a portion of the source current from the transition node as an output current to a load in an activated state based on the plurality of Josephson junction stages being triggered in a voltage state.

Another example includes a current driver system. The system includes a current source configured to provide a source current to a transition node. The system also includes a Josephson latch coupled to the transition node. The Josephson latch includes a plurality of Josephson junction stages being configured to conduct the source current from the transition node to a low-voltage rail in a deactivated state of the Josephson latch. The Josephson latch also includes a plurality of current distribution stages each comprising a bias inductor. The plurality of current distribution stages can be configured to conduct a respective plurality of portions of the source current to the respective plurality of Josephson junction stages. The bias inductor associated with a first one of the plurality of current distribution stages has an inductance that is less than the bias inductor associated with the remaining at least one of the plurality of current distribution stages. The Josephson latch is configured to conduct at least a portion of the source current from the transition node as an output current to a load in response to activation of the Josephson latch.

DETAILED DESCRIPTION

This disclosure relates generally to classical and quantum computing systems, and more specifically to a current driver system. The current driver system can be implemented in any of a variety of quantum or classical computer applications that may require a current source of varying amplitude. For example, the current driver system can be implemented in a word-write or bit-write line driver for a memory circuit. The current driver system includes a current source that provides a source current to a transition node and a Josephson latch. As an example, the current source can correspond to a flux pump and/or a storage inductor that is configured to provide the source current. The transition node can be a node to which the current source, the Josephson latch, and an output stage are coupled. The Josephson latch can include at least one, or a plurality of Josephson junction stages (e.g., Josephson junction pairs). As an example, each pair of the Josephson junction stages can be interconnected via a resistor to mitigate circulating currents that may result in self-triggering of the Josephson junction stages.

As an example, the source current can be provided from the transition node to flow through the Josephson junction stages as a current-clamped bias current during a deactivated state of the Josephson latch. As an example, the bias current can be provided to the Josephson junction stages via a respective plurality of current distribution stages that include a current clamping device to mitigate self triggering of the Josephson junction stages. In response to a trigger signal (e.g., a single flux quantum (SFQ) pulse), the Josephson junction stages can trigger to activate the Josephson latch, corresponding to the Josephson junction stages repeatedly triggering in a voltage state. In response, the Josephson latch provides a latching voltage at the transition node to divert at least a portion of the source current to be provided as an output current to the output stage. As a result, the bias current decreases, and thus deactivates the Josephson latch in response to decreasing to less than a predetermined threshold.

Figure 1:
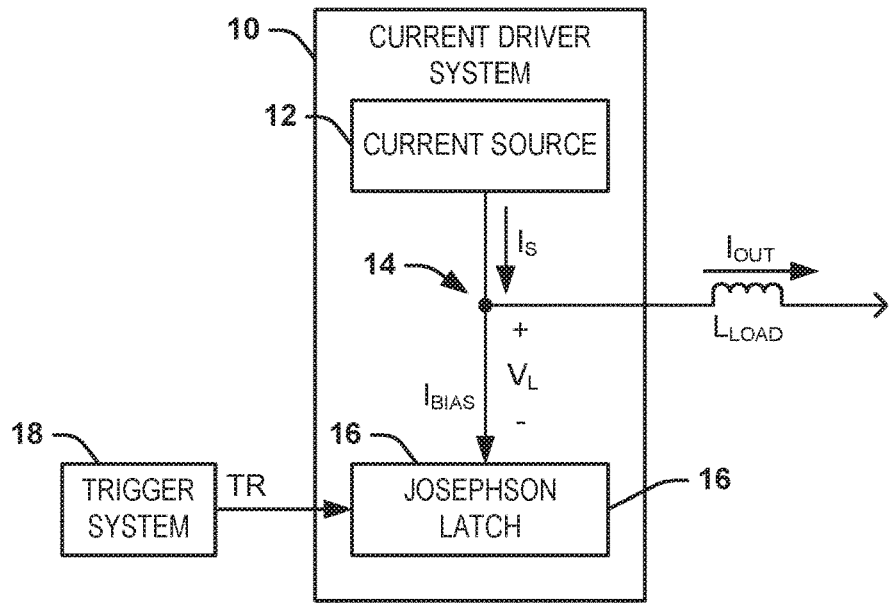
FIG. 1 illustrates an example of a current driver system.

FIG. 1 illustrates an example of a current driver system 10. The current driver system 10 can be implemented in any of a variety of quantum or classical computer applications that may require a current source of varying amplitude. For example, the current driver system can be implemented in a word-write or bit-write line driver for a memory circuit.

The current driver system 10 includes a current source 12 that provides a source current Is to a transition node 14. As an example, the current source 12 can correspond to a flux pump and/or a storage inductor that is configured to provide the source current Is. The transition node 14 is demonstrated in the example of FIG. 1 as interconnecting the current source 12, a Josephson latch 16, and a load inductor $L_{LOAD}$ that can correspond to an output stage. In the example of FIG. 1, the source current $I_S$ is demonstrated as flowing from the transition node 14 as a current-clamped bias current $I_{BIAS}$ to the Josephson latch 16 and/or as an output current $I_{OUT}$ through the load inductor $L_{LOAD}$. As an example, the Josephson latch 16 can include at least one current clamping device and an arrangement of Josephson junctions that can trigger to provide a latching voltage $V_L$, as described in greater detail herein.

As an example, the Josephson latch 16 can initially occupy a deactivated state. In the deactivated state of the Josephson latch 16, substantially all of the source current Is can be provided as the bias current $I_{BIAS}$, such that the output current $I_{OUT}$ can have an amplitude of approximately zero in the deactivated state of the Josephson latch 16. As described in greater detail herein, the Josephson latch 16 can include features to substantially mitigate unintended self-triggering in response to the bias current $I_{BIAS}$, and thus unintended triggering. In the example of FIG. 1, a trigger system 18 is configured to provide a trigger signal, demonstrated as TRG, to the Josephson latch 16. As an example, the trigger signal TRG can correspond to a single flux quantum (SFQ) pulse, such as a reciprocal quantum logic (RQL) pulse pair that includes a fluxon and a complementary anti-fluxon. The trigger signal TRG can thus be provided to activate the Josephson latch 16.

For example, in response to the trigger signal TRG and the bias current $I_{BIAS}$, the Josephson junctions in the Josephson latch 16 repeatedly trigger to activate the Josephson latch 16. The repeatedly triggered Josephson junctions can thus operate in the "voltage state" to provide the latching voltage $V_L$ at the transition node 14. In response, at least a portion of the source current $I_S$ is provided as the output current $I_{OUT}$ from the transition node 14. Concurrently, the bias current $I_{BIAS}$ decreases as the output current $I_{OUT}$ increases, such that the source current $I_S$ is linearly steered over time from being provided the bias current $I_{BIAS}$ to being provided as the output current $I_{OUT}$. As the bias current $I_{BIAS}$ decreases to less than a predetermined threshold (e.g., associated with the critical current of the Josephson junctions of the Josephson latch 16), the Josephson latch 16 can deactivate. As a result, the latching voltage $V_L$ can decrease to approximately zero as the Josephson junctions in the Josephson latch 16 return to the zero state.

As described previously, the Josephson latch 16 can include at least one current clamping device and an arrangement of Josephson junctions. For example, the current clamping device(s) and the arrangement of Josephson junctions can be configured to mitigate self-triggering of the Josephson junctions of the Josephson latch 16, as described in greater detail herein. As described herein, the term "self-triggering" of the Josephson junctions in the Josephson latch 16 refers to an unwanted triggering of the Josephson junctions of the Josephson latch 16 in the absence of the trigger signal TRG (e.g., and thus based solely on the bias current $I_{BIAS}$). Therefore, by mitigating the self-triggering of the Josephson junctions in the Josephson latch 16, the Josephson latch 16 can be activated reliably to provide the output current $I_{OUT}$ through the load inductor $L_{LOAD}$ solely in response to the bias current $I_{BIAS}$ and the trigger signal TRG.

Figure 2:
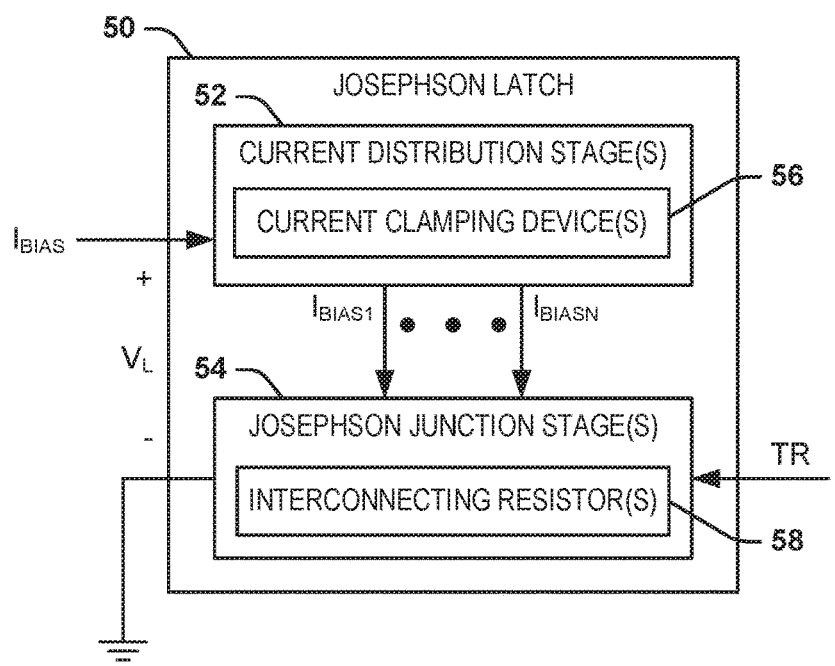
FIG. 2 illustrates an example of a Josephson latch.

FIG. 2 illustrates an example of a Josephson latch 50. The Josephson latch 50 can correspond to the Josephson latch 16 in the example of FIG. 1. Therefore, reference is to be made to the example of FIG. 1 in the following description of the example of FIG. 2.

The Josephson latch 50 includes at least one current distribution stage 52 and a respective at least one Josephson junction stage 54. The current distribution stage(s) 52 are each configured to conduct a portion of the bias current $I_{BIAS}$ as N respective portions of the bias current $I_{BIAS}$, demonstrated in the example of FIG. 2 as $I_{BIAS1}$ through $I_{BIASN}$, where N is a positive integer. As an example, each of the bias currents $I_{BIAS1}$ through $I_{BIASN}$ can have approximately equal amplitudes (e.g., with potential variation based on fabrication tolerance mismatches, as described in greater detail herein). As another example, one of the bias currents $I_{BIAS1}$ through $I_{BIASN}$ can have an amplitude that is slightly greater than the amplitudes of the remaining approximately equal amplitude bias currents $I_{BIAS1}$ through $I_{BIASN}$, as described in greater detail herein.

In the example of FIG. 2, the current distribution stage(s) 52 each include a respective current clamping device 56 (demonstrated in the example of FIG. 2 as "current clamping device(s) 56"). The current clamping device(s) 56 can be configured to limit the amplitude of the bias currents $I_{BIAS1}$ through $I_{BIASN}$ to a predetermined amplitude. As described in greater detail herein, the predetermined amplitude can be approximately slightly less than a predetermined critical current of a given one of the Josephson junction stage(s) 54. For example, each of the current clamping device(s) 56 can be configured as a shunted Josephson junction having a critical current that corresponds to the predetermined amplitude. As another example, each of the current clamping device(s) 56 can be configured as a tunable superconducting quantum interference device (SQUID) having configured to trigger at approximately the predetermined clamping amplitude. Because the SQUID can be tunable, the predetermined amplitude can thus be programmable.

As described previously, the Josephson latch 50 includes the Josephson junction stage(s) 54 that receive the respective bias currents $I_{BIAS1}$ through $I_{BIASN}$, respective, from the current distribution stage(s) 52. As an example, each of the Josephson junction stage(s) 54 can include a parallel pair of unshunted Josephson junctions that collectively define a critical current of a given one of the Josephson junction stage(s) 54. As an example, the critical current associated with the Josephson latch 50 can be defined by the sum of the critical currents of the Josephson junction stage(s) 54, which can thus define a maximum amplitude of the source current Is that can be provided to the transition node 14 in the example of FIG. 1, and thus the maximum amplitude of the output current $I_{OUT}$. Accordingly, the number of Josephson junction stages 54 can define the amplitude of the output current $I_{OUT}$ that can be provided from the current driver system 10.

Similar to as described previously, in response to the trigger signal TRG and the bias currents $I_{BIAS1}$ through $I_{BIASN}$, the Josephson junctions in the Josephson junction stage(s) 54 repeatedly trigger to activate the Josephson latch 50. The repeatedly triggered Josephson junctions can thus operate in the "voltage state" to provide the latching voltage $V_L$ at the transition node (not shown in the example of FIG. 2), and thus from ground and across the Josephson junction stage(s) 54 and the current distribution stage(s) 52. In response, at least a portion of the source current $I_S$ is provided as the output current $I_{OUT}$ from the transition node, similar to as described in the example of FIG. 1. Concurrently, the bias current $I_{BIAS}$, and thus the portions $I_{BIAS1}$ through $I_{BIASN}$, decreases as the output current $I_{OUT}$ increases. As the bias currents $I_{BIAS1}$ through $I_{BIASN}$ decrease to less than respective predetermined thresholds (e.g., associated with the critical current of the Josephson junctions of the Josephson stage(s) 54), the Josephson latch 50 can deactivate. As a result, the latching voltage $V_L$ can decrease to approximately zero as the Josephson junctions in the Josephson latch 50 return to the zero state Because the current clamping device(s) 56 provide current-clamping of the bias currents $I_{BIAS1}$ through $I_{BIASN}$, the current clamping device(s) 56 can substantially mitigate self-triggering of the Josephson junction stage(s) 54. For example, as described previously, the predetermined amplitude can be approximately slightly less than a predetermined critical current of a given one of the Josephson junction stage(s) 54. Therefore, the current clamping device(s) 56 can substantially clamp the amplitude of a given one of the bias currents $I_{BIAS1}$ through $I_{BIASN}$ to have a maximum amplitude that is slightly less than the critical current of a given one of the Josephson junction stage(s) 54. Accordingly, the current clamping device(s) 56 can substantially mitigate the unwanted occurrence of self-triggering of the Josephson junction stage(s) 54.

In addition, in the example of FIG. 2, the Josephson junction stage(s) 54 include one or more interconnecting resistors 58. As an example, in the example of the Josephson junction stage(s) 54 can include a plurality of Josephson junction stages 54, such that a given one of the interconnecting resistor(s) 58 interconnects a given pair of the Josephson junction stages 54. The interconnecting resistor(s) 58 can thus mitigate the presence of circulating currents that can cause unwanted self-triggering of the Josephson junction stages 54. For example, when the Josephson junctions of the Josephson junction stage(s) 54 are in the voltage state during activation of the Josephson latch 50, unequal occurrences of triggering of the Josephson junctions from one of the Josephson junction stages 54 to another can result in a circulating current in a given one of the Josephson junction stage(s) 54. The circulating current, when combined with a respective one of the bias currents $I_{BIAS1}$ through $I_{BIASN}$, could result in an unwanted self-triggering. However, the interconnecting resistor(s) 58 can dissipate a circulating current in a given one of the Josephson junction stage(s) 54, thus mitigating the possibility of self-triggering. For example, the interconnecting resistor(s) 58 can each have a small resistance, such that the respective interconnecting resistor 58 can have a resistance (e.g., approximately one ohm) that is sufficiently high to dissipate the circulating current but is sufficiently low to allow an SFQ pulse to trigger the respective Josephson junction stage 54.

Based on the arrangement of the current clamping device(s) 56 and the interconnecting resistor(s) 58, the Josephson latch 50 can provide the latching function to provide the source current Is as the output current $I_{OUT}$ at the desired time based on the trigger signal TRG. Particularly, the arrangement of the current clamping device(s) 56 and the interconnecting resistor(s) 58 can be such that unwanted self-triggering can be mitigated, such that the Josephson latch 50 is only activated in response to the bias current $I_{BIAS}$ and the trigger signal TRG in combination.

Figure 3:
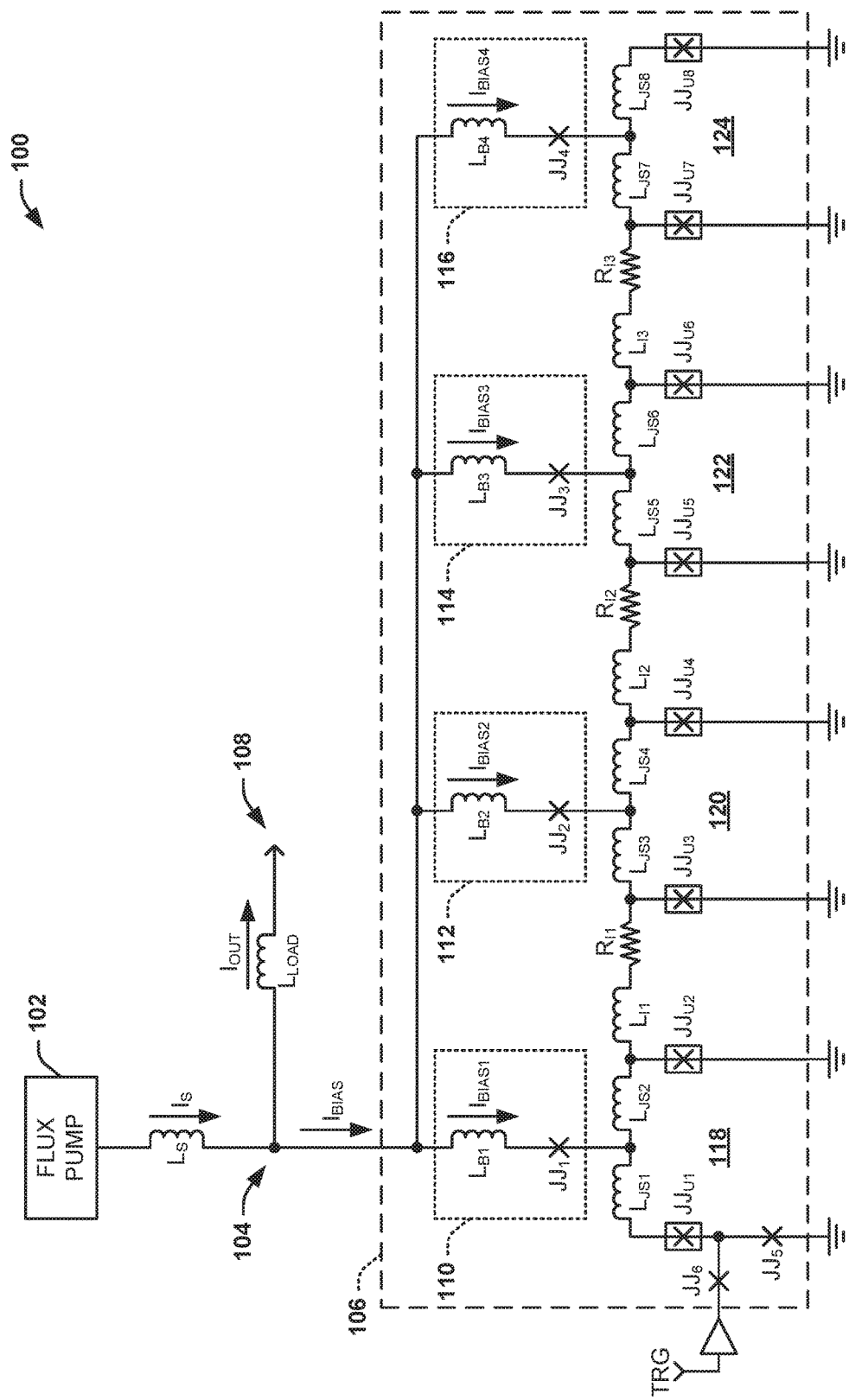
FIG. 3 illustrates another example of a current driver system.

FIG. 3 illustrates an example of a current driver system 100. The current driver system 100 can be implemented in any of a variety of quantum or classical computer applications that may require a current source of varying amplitude. For example, the current driver system can be implemented in a word-write or bit-write line driver for a memory circuit.

The current driver system 100 includes a flux pump 102 that provides a source current Is to a transition node 104. The flux pump 102 can correspond to the current source 12 in the example of FIG. 1, and is demonstrated as providing the source current Is through a storage inductor Ls. The transition node 104 is demonstrated in the example of FIG. 3 as interconnecting the storage inductor Ls, a Josephson latch 106, and a load inductor $L_{LOAD}$ that can correspond to an output stage. In the example of FIG. 3, the source current $I_S$ is demonstrated as flowing from the transition node 104 as an aggregate bias current $I_{BIAS}$ to the Josephson latch 106 and/or as an output current $I_{OUT}$ through the load inductor $L_{LOAD}$ to an output 108 (e.g., a word-write line).

As an example, the Josephson latch 106 can initially occupy a deactivated state. In the deactivated state of the Josephson latch 106, substantially all of the source current $I_S$ can be provided as the aggregate bias current $I_{BIAS}$, such that the output current $I_{OUT}$ can have an amplitude of approximately zero in the deactivated state of the Josephson latch 106. In the example of FIG. 3, the aggregate bias current $I_{BIAS}$ is provided to a first current distribution stage 110, a second current distribution stage 112, a third current distribution stage 114, and a fourth current distribution stage 116. The first current distribution stage 110 includes a bias inductor $L_{B1}$ in series with a shunted Josephson junction $JJ_1$, and is configured to conduct a first portion of the aggregate bias current $I_{BIAS}$, demonstrated as $I_{BIAS1}$. The second current distribution stage 112 includes a bias inductor $L_{B2}$ in series with a shunted Josephson junction $JJ_2$, and is configured to conduct a second portion of the aggregate bias current $I_{BIAS}$, demonstrated as $I_{BIAS2}$. The third current distribution stage 114 includes a bias inductor $L_{B3}$ in series with a shunted Josephson junction $JJ_3$, and is configured to conduct a third portion of the aggregate bias current $I_{BIAS}$, demonstrated as $I_{BIAS3}$. The fourth current distribution stage 116 includes a bias inductor $L_{B4}$ in series with a shunted Josephson junction $JJ_4$, and is configured to conduct a fourth portion of the aggregate bias current $I_{BIAS}$, demonstrated as $I_{BIAS4}$.

The Josephson latch 106 also includes a first Josephson junction stage 118, a second Josephson junction stage 120, a third Josephson junction stage 122, and a fourth Josephson junction stage 124. The first Josephson junction stage 118 includes a pair of input inductors $L_{JS1}$ and $L_{JS2}$ between which the bias current $I_{BIAS1}$ is provided via the current distribution stage 110, and includes a parallel pair of unshunted Josephson junctions $JJ_{U1}$ and $JJ_{U2}$. In addition, the first Josephson junction stage 118 includes an activation Josephson junction $JJ_5$ that interconnects the Josephson junction $JJ_{U1}$ and ground. The second Josephson junction stage 120 includes a pair of input inductors $L_{JS3}$ and $L_{JS4}$ between which the bias current $I_{BIAS2}$ is provided via the current distribution stage 112, and includes a parallel pair of unshunted Josephson junctions $JJ_{U3}$ and $JJ_{U4}$. The third Josephson junction stage 122 includes a pair of input inductors $L_{JS5}$ and $L_{JS6}$ between which the bias current $I_{BIAS3}$ is provided via the current distribution stage 114, and includes a parallel pair of unshunted Josephson junctions $JJ_{U5}$ and $JJ_{U6}$. The fourth Josephson junction stage 124 includes a pair of input inductors $L_{JS7}$ and $L_{JS8}$ between which the bias current $I_{BIAS4}$ is provided via the current distribution stage 116, and includes a parallel pair of unshunted Josephson junctions $JJ_{U7}$ and $JJ_{U8}$.

In addition, the Josephson junction latch 106 includes an interconnecting inductor $L_{I1}$ and an interconnecting resistor $R_{I1}$ that are arranged in series between the first and second Josephson junction stages 118 and 120. The Josephson junction latch 106 also includes an interconnecting inductor $L_{I2}$ and an interconnecting resistor $R_{I2}$ that are arranged in series between the second and third Josephson junction stages 120 and 122. The Josephson junction latch 106 further includes an interconnecting inductor $L_{I3}$ and an interconnecting resistor $R_{I3}$ that are arranged in series between the third and fourth Josephson junction stages 122 and 124.

The unshunted Josephson junctions $JJ_{U1}$ through $JJ_{U8}$ can define a critical current threshold of the Josephson latch 106. As an example, each of the Josephson junction stages 118, 120, 122, and 124 can have an approximately equal critical current threshold that is defined by a sum of the critical currents of the respective pairs of Josephson junctions $JJ_{U1}$ and $JJ_{U2}$, $JJ_{U3}$ and $JJ_{U4}$, $JJ_{U5}$ and $JJ_{U6}$, and $JJ_{U7}$ and $JJ_{U8}$. Therefore, the bias currents $I_{BIAS1}$ through $I_{BIAS4}$ can be provided at an amplitude that is slightly less than the critical currents of the respective Josephson junction stages 118, 120, 122, and 124, as described in greater detail herein. In addition, the critical current threshold of the Josephson latch 106, as a whole, can be defined by a sum of the critical currents of the Josephson junctions $JJ_{U1}$ through $JJ_{U8}$. Therefore, the source current Is can have an amplitude that is slightly less than the critical current threshold of the Josephson latch 106. As a result, the output current $Iou_T$ can be provided at an amplitude that is less than or equal to the source current $I_S$, which can be sufficiently high to provide suitable function for the load (e.g., providing a magnetic field of sufficient amplitude to write data in a hysteretic magnetic Josephson junction).

In the example of FIG. 3, the Josephson junctions $JJ_1$ through $JJ_4$ of the current distribution stages 110, 112, 114, and 116 correspond to respective current clamping devices. The Josephson junctions $JJ_1$ through $JJ_4$ can be configured to limit the amplitude of the bias currents $I_{BIAS1}$ through $I_{BIAS4}$ to a predetermined amplitude. As an example, due to fabrication and/or tolerance mismatches, the bias inductors $L_{B1}$ through $L_{B4}$ may not be fabricated the same, thus resulting in a mismatch in amplitude of the bias currents $I_{BIAS1}$ through $I_{BIAS4}$. For example, in response to a given one of the bias currents $I_{BIAS1}$ through $I_{BIAS4}$ exceeding a predetermined threshold amplitude corresponding to a critical current of the respective Josephson junctions $JJ_1$ through $JJ_4$, the respective one of the Josephson junctions $JJ_1$ through $JJ_4$ will trigger to clamp the amplitude of the respective one of the bias currents $I_{BIAS1}$ through $I_{BIAS4}$ to the predetermined threshold amplitude. As an example, the predetermined threshold amplitude can be less than the critical current of the respective one of the Josephson junction stages 118, 120, 122, and 124. Accordingly, by clamping the bias currents $I_{BIAS1}$ through $I_{BIAS4}$ to less than the critical current of the respective Josephson junction stages 118, 120, 122, and 124, the respective Josephson junction stages 118, 120, 122, and 124 are prevented from triggering absent the trigger signal TRG (as described in greater detail herein). While the current clamping devices are demonstrated in the example of FIG. 3 as the Josephson junctions $JJ_1$ through $JJ_4$, it is to be understood that tunable SQUIDs can be implemented instead, with the tunable SQUIDs having a programmable critical current threshold and being configured to trigger at approximately the predetermined clamping amplitude.

In the example of FIG. 3, a trigger system 126, demonstrated as a Josephson transmission line (JTL), is configured to provide a trigger signal TRG, which can be provided as an RQL signal. In the example of FIG. 3, the trigger signal TRG is provided through a reflection Josephson junction $JJ_6$ to the first Josephson junction stage 118 to trigger the activation Josephson junction $JJ_5$. Because the trigger signal TRG can be provided as an RQL signal, the reflection Josephson junction $JJ_6$ can mitigate reflection of the anti-fluxon back into the JTL 126.

In response to triggering, the activation Josephson junction $JJ_5$ can provide an SFQ pulse to the Josephson junction $JJ_{U2}$, which can trigger to provide an SFQ pulse to the Josephson junction $JJ_{U1}$, and to the Josephson junction $JJ_{U3}$ via the interconnecting inductor $L_{I1}$ and the interconnecting resistor $R_{I1}$. The Josephson junction $JJ_{U3}$ can trigger to provide an SFQ pulse to the Josephson junction $JJ_{U2}$ via the interconnecting inductor $L_{I1}$ and the interconnecting resistor $R_{I1}$, and can provide an SFQ pulse to trigger the Josephson junction $JJ_{U4}$. The Josephson junction $JJ_{U4}$ can provide an SFQ pulse to the Josephson junction $JJ_{U3}$ and to the Josephson junction $JJ_{U5}$ via the interconnecting inductor Lie and the interconnecting resistor $R_{I2}$. Thus, the Josephson junctions $JJ_{U1}$ through $JJ_{U8}$ sequentially generate SFQ pulses in response to being triggered. Because the Josephson junctions $JJ_{U1}$ through $JJ_{U8}$ are unshunted, the Josephson junctions $JJ_{U1}$ through $JJ_{U8}$ continue to sequentially trigger to provide repeated SFQ pulses that result in the voltage state until the bias currents $I_{BIAS1}$ through $I_{BIAS4}$ decrease to a predetermined amplitude (e.g., associated with the critical currents of the respective Josephson junction stages 118, 120, 122, and 124).

In addition, the current distribution stages 110, 112, 114, and 116 can be fabricated to facilitate the sequential triggering of the Josephson junctions $JJ_{U1}$ through $JJ_{U8}$, such as in response to a smaller amplitude of the aggregate bias current $I_{BIAS}$. For example, the bias inductor $L_{B1}$ in the current distribution stage 110 can have an inductance that is less than the bias inductors $L_{B2}$ through $L_{B4}$ in the respective current distribution stages 112, 114, and 116. As a result, the bias current $I_{BIAS1}$ can have a disproportionately greater amplitude relative to the bias currents $I_{BIAS2}$, $I_{BIAS3}$, and $I_{BIAS4}$. As a result, the aggregate bias current $I_{BIAS}$ can be provided at a smaller amplitude to provide the first bias current $I_{BIAS1}$ at a sufficient amplitude to activate the Josephson latch 106 in response to the trigger signal TRG. In other words, because the relative inductance of the bias inductor $L_{B1}$ can be less than the inductance of the bias inductors $L_{B2}$, $L_{B3}$, and $L_{B4}$, resulting in the relatively greater amplitude of the bias current $I_{BIAS1}$, the Josephson latch 106 can be activated at a greater range (e.g., lesser minimum amplitude) of the aggregate bias current $I_{BIAS}$. The disproportionately greater bias current $I_{BIAS1}$ can also provide preferential triggering of the first Josephson junction stage 118 to provide a proper triggering sequence of the Josephson junction stages 118, 120, 122, and 124.

During activation of the Josephson latch 106, the voltage state of the triggering of the Josephson junctions $JJ_{U1}$ through $JJ_{U8}$ can thus provide the voltage $V_L$ at the transition node 104 to decrease the amplitude of the aggregate bias current $I_{BIAS}$ leaving the transition node 104, and to thus increase the amplitude of the output current $I_{OUT}$ leaving the transition node 104, effectively steering the source current $I_S$ from being provided as the aggregate bias current $I_{BIAS}$ to being provided as the output current $I_{OUT}$. As described previously, the Josephson junctions $JJ_{U1}$ through $JJ_{U8}$ continue to sequentially trigger to provide repeated SFQ pulses that result in the voltage state until the bias currents $I_{BIAS1}$ through $I_{BIAS4}$ decrease to a predetermined amplitude. Therefore, eventually the aggregate bias current $I_{BIAS}$ decreases to a sufficiently low amplitude, and thus the portions $I_{BIAS1}$ through $I_{BIAS4}$ likewise decrease to a sufficiently low amplitude, to deactivate the Josephson junctions $JJ_{U1}$ through $JJ_{U8}$, and thus to deactivate the Josephson latch 106. As a result, the aggregate bias current $I_{BIAS}$ can again increase as the output current $I_{OUT}$ is consumed by the load.

Because of the interconnect resistors $R_{J1}$ through $R_{J3}$, any circulating currents that may reside in the deactivated Josephson junction stages 118, 120, 122, and 124 is dissipated, thus mitigating any self-triggering that may result from the increase of the respective bias currents $I_{BIAS1}$ through $I_{BIAS4}$. Additionally, as described previously, the Josephson junctions $JJ_1$ through $JJ_4$ in the respective current distribution stages 110, 112, 114, and 116 can clamp the amplitudes of the respective bias currents $I_{BIAS1}$ through $I_{BIAS4}$, thus likewise mitigating any self-triggering that may result from the increase of the respective bias currents $I_{BIAS1}$ through $I_{BIAS4}$. Accordingly, even after the aggregate bias current $I_{BIAS}$ has sufficient amplitude, the Josephson latch 106 does not activate again until the trigger signal TRG is provided. As a result, the Josephson latch 106 can be reliably activated and predictably operated to control the flow of the output current $I_{OUT}$ to the load.

What have been described above are examples of the disclosure. It is, of course, not possible to describe every conceivable combination of components or method for purposes of describing the disclosure, but one of ordinary skill in the art will recognize that many further combinations and permutations of the disclosure are possible. Accordingly, the disclosure is intended to embrace all such alterations, modifications, and variations that fall within the scope of this application, including the appended claims.

What is claimed is:

1. A current driver system comprising:
   a current source configured to provide a source current to a transition node; and
   a Josephson latch comprising at least one Josephson junction stage configured to conduct the source current from the transition node in a deactivated state of the Josephson latch, and to switch to an activated state in response to a trigger signal to switch the at least one Josephson junction stage to a voltage state to provide at least a portion of the source current from the transition node as an output current to a load.

2. The system of claim 1, wherein the trigger signal is provided to the Josephson latch as a single flux quantum (SFQ) pulse provided from a Josephson transmission line (JTL) to trigger the at least one Josephson junction stage.

3. The system of claim 1, wherein the Josephson latch is configured to conduct the source current from the transition node to a low-voltage rail as a bias current to bias each of the at least one Josephson junction stage.

4. The system of claim 3, wherein the Josephson latch comprises at least one resistor that each interconnects a pair of the plurality of Josephson junction stages to substantially mitigate circulating currents in the Josephson latch.

5. The system of claim 3, wherein the Josephson latch has a critical current threshold corresponding to an activation amplitude of the bias current that is associated with a quantity of the plurality of Josephson junction stages.

6. The system of claim 3, wherein the Josephson latch further comprises at least one current distribution stage each configured to provide a respective at least one portion of the bias current to the respective at least one Josephson junction stage, each of the at least one current distribution stage comprises:
   a bias inductor coupled to the transition node and being configured to conduct the respective at least one portion of the bias current; and
   a clamping device coupled to the bias inductor and being configured to clamp the respective at least one portion of the bias current at a predetermined amplitude.

7. The system of claim 6, wherein the at least one current distribution stage comprises a first current distribution stage configured to conduct a respective first portion of the bias current to a respective first Josephson junction stage and at least one remaining current distribution stage configured to conduct a respective at least one remaining portion of the bias current to a respective at least one remaining Josephson junction stage, wherein the bias inductor associated with the first current distribution stages has an inductance that is less than the bias inductor associated with the remaining at least one current distribution stage to increase an amplitude of the first portion of the bias current relative to the at least one remaining portion of the bias current.

8. The system of claim 6, wherein the clamping device is configured as a Josephson junction configured to trigger at approximately the predetermined amplitude of the respective at least one portion of the bias current to clamp the at least one portion of the bias current at approximately the predetermined amplitude.

9. The system of claim 6, wherein the clamping device is configured as a tunable superconducting quantum interference device (SQUID) configured to trigger at approximately the predetermined amplitude of the respective at least one portion of the bias current to clamp the at least one portion of the bias current at approximately the predetermined amplitude, wherein the predetermined amplitude is programmable.

10. The system of claim 1, wherein the Josephson latch further comprises an input Josephson junction coupled to a first Josephson junction stage of the at least one Josephson junction stage, the input Josephson junction being configured to cancel a negative fluxon generated by the trigger pulse that is provided as a reciprocal quantum logic (RQL) pulse.

11. A current driver system comprising:
    a current source configured to provide a source current to a transition node; and
    a Josephson latch comprising a plurality of Josephson junction stages and at least one resistor that each interconnects a pair of the plurality of Josephson junction stages, the Josephson latch being configured to conduct the source current from the transition node in a deactivated state and to conduct at least a portion of the source current from the transition node as an output current to a load in an activated state based on the plurality of Josephson junction stages being triggered in a voltage state.

12. The system of claim 11, wherein the Josephson latch further comprises a plurality of current distribution stages configured to provide the respective plurality of portions of the source current being provided as a bias current to the respective plurality of Josephson junction stages, each of the plurality of current distribution stages comprises:
    a bias inductor coupled to the transition node and being configured to conduct the respective at least one portion of the bias current; and
    a clamping device coupled to the bias inductor and being configured to clamp the respective at least one portion of the bias current at a predetermined amplitude.

13. The system of claim 12, wherein the plurality of current distribution stages comprises a first current distribution stage configured to conduct a respective first portion of the bias current to a respective first Josephson junction stage and at least one remaining current distribution stage configured to conduct a respective at least one remaining portion of the bias current to a respective at least one remaining Josephson junction stage, wherein the bias inductor associated with the first current distribution stages has an inductance that is less than the bias inductor associated with the remaining at least one current distribution stage to increase an amplitude of the first portion of the bias current relative to the at least one remaining portion of the bias current.

14. The system of claim 12, wherein the clamping device is configured as a Josephson junction configured to trigger at approximately the predetermined amplitude of the respective at least one portion of the bias current to clamp the at least one portion of the bias current at approximately the predetermined amplitude.

15. The system of claim 11, wherein the Josephson latch is configured to switch to the activated state in response to a reciprocal quantum logic (RQL) trigger pulse, wherein the Josephson latch further comprises an input Josephson junction coupled to a first Josephson junction stage of the at least one Josephson junction stage, the input Josephson junction being configured to cancel a negative fluxon generated by the RQL trigger pulse.

16. A current driver system comprising:
a current source configured to provide a source current to a transition node; and
a Josephson latch coupled to the transition node and comprising:
a plurality of Josephson junction stages being configured to conduct the source current from the transition node to a low-voltage rail in a deactivated state of the Josephson latch; and
a plurality of current distribution stages each comprising a bias inductor, the plurality of current distribution stages being configured to conduct a respective plurality of portions of the source current to the respective plurality of Josephson junction stages, the bias inductor associated with a first one of the plurality of current distribution stages has an inductance that is less than the bias inductor associated with the remaining at least one of the plurality of current distribution stages;
wherein the Josephson latch is configured to conduct at least a portion of the source current from the transition node as an output current to a load in response to activation of the Josephson latch.

17. The system of claim 16, wherein each of the plurality of current distribution stages comprises a current clamping device configured to clamp an amplitude of each of the source current provided as a respective plurality of portions of a bias current at a predetermined amplitude in the deactivated state of the Josephson latch.

18. The system of claim 17, wherein the clamping device is configured as a Josephson junction configured to trigger at approximately the predetermined amplitude of the respective at least one portion of the bias current to clamp the at least one portion of the bias current at approximately the predetermined amplitude.

19. The system of claim 16, wherein the Josephson latch further comprises at least one resistor that each interconnects a pair of the plurality of Josephson junction stages to substantially mitigate circulating currents in the Josephson latch.

20. The system of claim 16, wherein the Josephson latch is configured to switch to the activated state in response to a reciprocal quantum logic (RQL) trigger pulse, wherein the Josephson latch further comprises an input Josephson junction coupled to a first Josephson junction stage of the at least one Josephson junction stage, the input Josephson junction being configured to cancel a negative fluxon generated by the RQL trigger pulse.

\* \* \* \* \*